US005900572A

United States Patent [19]

Aaroe

[11] Patent Number: 5,900,572

[45] **Date of Patent: * May 4, 1999**

[54] PLIABLE PICKUP FOR STRINGED INSTRUMENT

[75] Inventor: Kenneth T. Aaroe, Vernalis, Calif.

[73] Assignee: Donald Dean Markley, Saratoga, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/680,491

[22] Filed: Jul. 15, 1996

[51] Int. Cl.$^{6}$ .............................. G10H 3/18; H01L 41/04; H01L 41/08

[52] U.S. Cl. ...................... 84/731; 84/DIG. 24; 310/322; 310/334; 310/339; 310/800

[58] Field of Search ..................... 84/730–732, DIG. 24; 310/800, 339, 334, 328, 321, 322

[56] References Cited

U.S. PATENT DOCUMENTS

| | | | |
|---|---|---|---|
| 4,278,000 | 7/1981 | Saito et al. | 84/DIG. 24 |
| 4,378,721 | 4/1983 | Kaneko et al. | 84/DIG. 24 |
| 4,491,051 | 1/1985 | Barcus | 84/DIG. 24 |
| 4,741,238 | 5/1988 | Carriveau . | |
| 4,913,024 | 4/1990 | Carriveau . | |
| 5,123,325 | 6/1992 | Turner . | |
| 5,155,285 | 10/1992 | Fishman | 84/731 |
| 5,218,159 | 6/1993 | McClish | 84/731 |
| 5,404,783 | 4/1995 | Feiten et al. . | |
| 5,455,381 | 10/1995 | Juszkiewicz et al. . | |
| 5,539,147 | 7/1996 | Hoshino . | |

*Primary Examiner*—Stanley J. Witkowski
*Attorney, Agent, or Firm*—Robert O. Guillot

[57] ABSTRACT

An extremely flexible piezoelectric pickup for stringed instruments is formed of a flat shielded conductor with a plurality of spaced piezo crystals embedded between the conductor and its shield. Its width is less than 0.090 inches, its height between piezo crystals is less than 0.020 inches and at the crystals is less than 0.050 so that the location of each crystal is clearly visible and can be accurately positioned on an instrument.

17 Claims, 1 Drawing Sheet

PLIABLE PICKUP FOR STRINGED INSTRUMENT

This invention is for a sound to electrical signal transducer and in particular to a novel piezoelectric transducer that employs a plurality of piezoelectric elements between the string support and the stringed instrument body.

Piezoelectric elements, or piezo crystals, are transducers which have the ability to convert electric signals into corresponding mechanical signals and also to generate a voltage in response to an applied mechanical force. In this latter mode, the sensitivity of the piezo to stringed instrument vibration has made it popular for use as a pickup for guitars and the like.

There are many patents describing piezoelectric pickups. For example, U.S. Pat. No. 4,491,051 and U.S. Pat. No. 4,774,867 each show a pickup having a plurality of piezo crystals sandwiched between two flat rigid conductors and held together with an outer wrapping of electric shielding. In this configuration the pickup is limited in its performance.

Both of these prior art pickups are somewhat flexible and may be slightly arched without damage. But there are often times when an extra flexible pickup is needed, for example, on the curved face of a violin or the bridge of a cello. Because of their structural rigidity, each piezo element may not conform completely to the surface between which they are placed, thereby limiting their electrical performance even within the flat surfaces of the saddle slot area of a standard guitar. Also the mechanical coupling caused by the shield wrapping around the two opposing electrical active compression surfaces of the piezo elements will decrease the electrical output of the pickup.

The pickup of the present invention is so flexible that it may be tied in a knot without damage. With this flexibility, each piezo element is free to move in a wide range relative to one another and there is virtually no mechanical coupling between adjacent elements or the two active surfaces of the elements themselves. Because the piezo elements form the thickest part of the pickup structure, the exact location of each piezo elements clearly visible, making the pickup easy to position under the strings of an instrument. It is inexpensive and very simple to assemble. Another important feature is that the pickup may be shortened by cutting the laminations cleanly between the piezo elements for shorter bridges such as that of a mandolin.

Briefly described, the pickup of the invention is comprised of a flat shielded cable made of alternate conductive and dielectric layers with a plurality of spaced piezoelectric elements embedded within the layers.

DESCRIPTION OF THE DRAWINGS

In the drawings which illustrate the preferred embodiment of the invention.

DETAILED DESCRIPTION OF THE PREFERRED EMBODIMENT

The piezoelectric pickup of the invention is comprised of five very thin and flexible layers with a plurality of piezoelectric elements embedded in them. It has a thickness of 0.042 inches at the site of each piezo element, a thickness of 0.015 inches between the elements and a overall width of 0.085. The length is at the builders discretion; it may be long for mounting under the bridge of a bass violin or short for mounting to the bridge of a mandolin, and may be cut to a desired length after completion.

Figure 1:
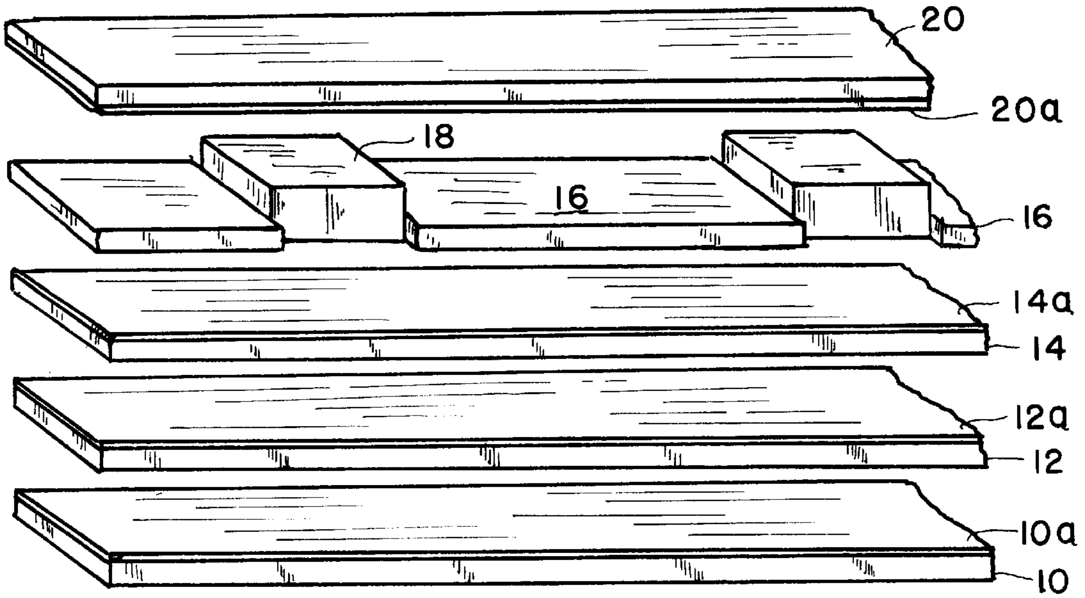
FIG. 1 is an exploded perspective view of the piezoelectric pickup.

FIG. 1 illustrates the five layers 10, 12, 14, 16, 20 of the piezoelectric pickup. Layers 10, 14 and 20 are formed of a conductive material, such as a substantially flat, very flexible metal foil or metallized cloth or plastic, and are coated with a layer of a conductive adhesive 10*a,* 14*a* and 20*a*. The layers 12 and 16 are formed of a thin, flexible dielectric tape, such as Mylar. Dielectric layer 12 is coated with an adhesive 12*a*.

Mounted between the conductive layers 14 and 20, and appropriately spaced according to the spacing of the strings of the instrument for which the pickup is intended, are a plurality of piezoelectric elements 18 arranged with their compressing surfaces in contact with the conductive adhesive coating on the layers 14 and 20. The piezo elements 18 are separated by short segments 16 of dielectric which serves as insulation between the conductive layers 14 and 20.

The piezoelectric elements 18 may be plastic piezo or rubber piezo but preferably are ceramic because ceramic piezo produces a strong output whereas the very high impedance of rubber and plastic piezo elements requires preamplification. The thickness of each of the conductive layers 10, 14, 20 including its conductive adhesive coating is 0.004 inches, each dielectric layer 12 with the adhesive coating 12*a* is 0.003 inches and the dielectric layer 16 of short segments without any adhesive is 0.002. The piezo elements 18 used in the preferred embodiment are 0.030 inches thick and have 0.070 inch square compressing surfaces. The total width of the pickup is 0.085 inches.

Figure 2:
FIG. 2 is an enlarged elevational view of the pickup with six piezoelectric elements.

FIG. 2 is an elevational view illustrating a completed pickup using the preferred embodiment dimensions shown in the above paragraph. The very flexible layers in which the piezo elements are embedded are very thin and the total thickness of the spaces 22 between the piezo elements is only 0.017 inches. The piezo elements, which are 0.030 inches thick, replace the dielectric layer 16 of 0.002 inches so that the total maximum thickness of the pickup at each piezo element 24 is 0.045 inches. The spacing between piezo elements depends upon the string spacing of the instrument; for guitars, it is usually ⅜ inches. As previously noted the total length is at the builder's discretion since the pickup may be easily cut with a sharp blade. It is also pointed out that the location of each piezoelectric element is clearly visible so that the pickup can easily be accurately positioned with respect to a string It is important to note that the thin laminated conductive shielding that surrounds the piezoelectric elements 24 is not only pliable but also is much thinner in the areas 22 between the piezos which are the highest and thickest part of the pickup. Because of this thickness, the piezo elements will be the sole support for a string support, such as a bridge or saddle, and its associated string. For this reason and because the piezos are free and unencumbered by the shielding and dielectric, the electrical output of the piezos will be of the highest reproductive quality.

Figure 3:
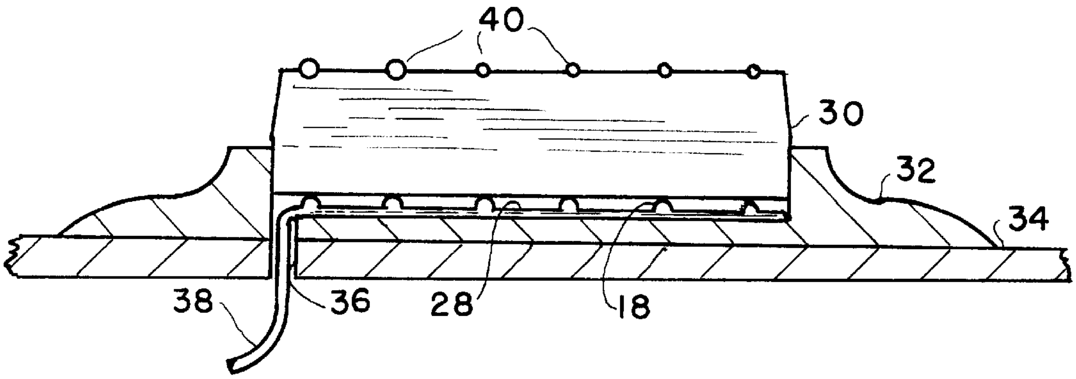
FIG. 3 is a sectional view of a guitar bridge and saddle illustrating the mounting of the pickup in a guitar.

FIG. 3 is an elevational view illustrating the preferred mounting of the piezoelectric pickup 28 under the saddle 30 in a bridge 32 on a guitar 34. In this type of mounting, a small hole 36 is drilled under the saddle 30 and through the bridge 32 and its underlying guitar sounding board 34 for passage of the pickup 28 that is connected to a coaxial cable 38 that leads from the pickup to a jack in the outer body of the stringed instrument. Because the pickup is so pliable and has such a small cross section, the entire pickup may pass easily pass through the hole 36 from inside the instrument structure. This is the preferred method of installation in a guitar. It should be noted at this point that when this pickup is installed on an existing guitar it is not necessary to solder the pickup's interconnecting coaxial cable 38 to the jack after it has been installed in the saddle bridge slot. This is due to its flexibility and small cross section. The pickup can be connected to the coaxial cable 38 and the coax 38 connected to the jack at the assembly factory. When installed in the guitar only the hole for the jack in the body of the guitar and the hole 36 need by drilled and no soldering is required near the fine finish of the guitar.

Normally, the ideal location of the piezoelectric elements 18 in the pickup 28 is to position the element where it receives maximum compressional variations from the sound source. In some stringed instruments such as a bass which has a footed bridge this may be in the small area between the feet and the instrument sound board. In a guitar, such as shown in FIG. 3, the preferred location for maximum signal strength from a minimum number of piezoelectric elements is directly beneath each string 40. However, excellent output strength is also obtained by placing two piezoelectric elements equidistant from each string in a pickup.

I claim:

1. A flexible pickup for stringed instruments comprising:

three narrow, very thin and pliable electrically conductive strips, said strips being coplanar and parallel and electrically separated by two very thin layers of pliable dielectric material;

a plurality of thin piezoelectric elements embedded in a first one of said two layers of dielectric material, said piezoelectric elements having their electrically active opposite surfaces in electrical contact with two adjacent conductive strips, said piezoelectric elements being spaced apart and located at predetermined positions in said first layer of dielectric material; and wherein each of said electrically active surfaces of each said piezoelectric element is fixedly engaged with one of said conductive strips utilizing an electrically conductive adhesive.

2. A pickup as described in claim 1 wherein its maximum height at a piezoelectric element is greater than its maximum height between said elements.

3. A pickup as described in claim 1 wherein said piezoelectric elements are ceramic.

4. A pickup as described in claim 1 wherein said conductive strips are comprised of metal foil tape with a conductive adhesive on one surface.

5. A pickup as described in claim 1 wherein said pliable dielectric material is adhesive tape.

6. A pickup for stringed instruments as described in claim 1 wherein said first layer of dielectric material is comprised of a plurality of dielectric segments, wherein at least one of said segments is disposed between each of said piezoelectric elements.

7. A pickup for stringed instruments comprising:

a pliable, substantially planar first conductive member;

a plurality of separate piezoelectric elements being disposed upon said first conductive member in a spaced apart relationship, each said piezoelectric element having a thickness T;

a plurality of separate dielectric segments being disposed upon said first conductive member, such that one said dielectric segment is disposed between each said piezoelectric element, each said dielectric segment having a thickness D; said thickness T of said piezoelectric elements being greater than said thickness D of said dielectric segments;

a pliable, substantially planar second conductive member being disposed upon said piezoelectric elements and upon said dielectric segments;

an electrical cable being connected to said conductive members to transmit electrical signals generated by said piezoelectric elements.

8. A pickup for stringed instruments as described in claim 7 wherein each said piezoelectric element includes two electrically active opposite surfaces, and wherein at least one said surface of each said piezoelectric element is fixedly engaged with one of said first and second conductive members.

9. A pickup for stringed instruments as described in claim 8 wherein said surface of said piezoelectric element is engaged with said conductive member utilizing an electrically conductive adhesive.

10. A pickup for stringed instruments as described in claim 7 wherein each said dielectric segment includes two opposite surfaces, and wherein at least one said surface of each said dielectric segment is fixedly engaged to at least one of said first and second conductive members.

11. A pickup for stringed instruments as described in claim 7 wherein each said piezoelectric element includes two electrically active opposite surfaces, and wherein each said surface of each said element is fixedly engaged to one of said first and second conductive members.

12. A pickup for stringed instruments as described in claim 11 wherein each said dielectric segment includes two oppositely disposed surfaces, and wherein each said dielectric surface is fixedly engaged to one of said first and second conductive members.

13. A pickup for stringed instruments as described in claim 12 wherein each said electrically active surface of each said piezoelectric element is engaged with one of said first and second conductive members utilizing an electrically conductive adhesive.

14. A pickup for stringed instruments as described in claim 13 wherein said first and second conductive members are comprised of metal foil tape with an electrically conductive adhesive on one surface thereof.

15. A pickup for stringed instruments as described in claim 7 wherein said first and second conductive members are comprised of metal foil tape with an electrically conductive adhesive on one surface thereof.

16. A pickup for stringed instruments comprising:

a pliable, substantially planar first conductive member;

a pliable, substantially planar dielectric member being disposed upon said first conductive member;

a pliable, substantially planar second conductive member being disposed upon said dielectric member;

a plurality of separate piezoelectric elements being disposed upon said second conductive member in a spaced apart relationship, each said piezoelectric element having a thickness T;

a plurality of separate dielectric segments being disposed upon said second conductive layer, such that one said dielectric segment is disposed between each said piezoelectric element, each said dielectric segment having a thickness D; said thickness T of said piezoelectric elements being greater than said thickness D of said dielectric segments;

a pliable, substantially planar third conductive layer being disposed upon said piezoelectric elements and upon said dielectric segments;

each said piezoelectric element including two electrically active opposite surfaces, and wherein each said electrically active surface of each said piezoelectric element is fixedly engaged to one of said second and third conductive members;

an electrical cable being connected to said conductive layers to transmit electrical signals generated by said piezoelectric elements.

17. A pickup for stringed instruments as described in claim 16 wherein said first, second and third conductive members are comprised of metal foil tape with an electrically conductive adhesive on one surface thereof.

* * * * *